United States Patent [19]

Tanaka et al.

[11] Patent Number: 5,525,582

[45] Date of Patent: Jun. 11, 1996

[54] JOSEPHSON JUNCTION DEVICE FORMED OF OXIDE SUPERCONDUCTOR AND PROCESS FOR PREPARING THE SAME

[75] Inventors: Saburo Tanaka; Takashi Matsuura; Hideo Itozaki, all of Hyogo, Japan

[73] Assignee: Sumitomo Electric Industries, Ltd., Osaka, Japan

[21] Appl. No.: 327,793

[22] Filed: Oct. 20, 1994

Related U.S. Application Data

[62] Division of Ser. No. 69,912, Jun. 1, 1993, Pat. No. 5,382,566.

[30] Foreign Application Priority Data

May 29, 1992 [JP] Japan .................. 4-164151

[51] Int. Cl.$^6$ .............. H01L 29/06; H01L 39/22; H01B 12/00
[52] U.S. Cl. .............. 505/190; 257/33; 257/34; 257/35; 505/191; 505/234; 505/239; 427/62; 427/63
[58] Field of Search .............. 257/34, 35, 33; 505/190–193, 234, 239, 702, 703; 427/62, 63

[56] References Cited

U.S. PATENT DOCUMENTS

| 5,134,117 | 7/1992 | Diiorio et al. | 257/33 |
| 5,157,466 | 10/1992 | Char et al. | 257/33 |

FOREIGN PATENT DOCUMENTS

| 0496215 | 7/1992 | European Pat. Off. . |
| 4212028 | 11/1992 | Germany . |
| 58-9336 | 1/1983 | Japan . |
| 63-306675 | 12/1988 | Japan . |
| 1-241874 | 9/1989 | Japan .................. 257/34 |
| 3-270020 | 12/1991 | Japan . |

OTHER PUBLICATIONS

Daly et al, "Substrate Step–Edge YBaCuO if Squids", Appl. Phys. Lett., vol. 58, No. 5, 4 Feb. 1991, pp. 543–545.
Friedl et al., "Transport Properties Of Epitaxial $YBa_2Cu_3O_x$ Films At Step Edges," Appl. Phys. Lett., vol. 59:2751–2753, (1991).
Martens et al., "Tl–Ca–Ba–Cu–O Step–Edge Josephson Junctions," Appl. Phys. Lett. vol. 60:1141–1143, (1992).
Roas, "Patterning Of Epitaxial $YBa_2Cu_3O_x$ Insulator Multilayers With A High–Temperature–Resistant Lift–Off Mask," Appl. Phys. Lett., vol. 59:2594–2596, (1991).

Primary Examiner—Mahshid Saadat
Attorney, Agent, or Firm—Foley & Lardner

[57] ABSTRACT

A Josephson junction device comprising a single crystalline substrate including a principal surface, a layer of the same material as the substrate formed on the principal surface of the substrate so as to form a step on the principal surface, and an oxide superconductor thin film formed on the principal surface of the substrate. The oxide superconductor thin film includes a first and a second superconducting portions respectively positioned above and below the step, which are constituted of single crystals of the oxide superconductor, a junction portion between the first and the second superconducting portions, which is constituted of a single crystal of the oxide superconductor of which crystal orientation is different from those of the first and second superconducting portions, and grain boundaries between the first superconducting portion and the junction portion and between the second superconducting portion and the junction portion, which constitute one weak link of the Josephson junction.

11 Claims, 2 Drawing Sheets

JOSEPHSON JUNCTION DEVICE FORMED OF OXIDE SUPERCONDUCTOR AND PROCESS FOR PREPARING THE SAME

This application is a division of application Ser. No. 08/069,912, filed Jun. 1, 1993, now U.S. Pat. No. 5,382,566.

BACKGROUND OF THE INVENTION

1. Field of the Invention

The present invention relates to a Josephson junction device formed in oxide superconductor and a process for preparing the Josephson junction device, and more specifically to a Josephson junction device of an oxide superconductor, of which a barrier of the weak link is constituted of grain boundaries and a process for preparing the Josephson junction device.

2. Description of Related Art

A Josephson junction device which is one of superconducting devices can be realized in various structures. Among the various structures, the most preferable structure in practice is a stacked junction realized by a thin non-superconductor layer sandwiched between a pair of superconductors. However, a point contact type junction, a Dayem bridge type junction and a variable thickness bridge type junction which are composed of a pair of superconductor regions which are weakly linked to each other also exhibit Josephson effect. In general, these Josephson junctions have fine structures in which the superconductor and/or non-superconductor are composed of thin films.

In order to realize a stacked type junction by using an oxide superconductor, a first oxide superconductor thin film, a non-superconductor thin film and a second oxide superconductor thin film are stacked on a substrate in the alone mentioned order.

In the above mentioned stacked type junction, an insulator MgO etc., a semiconductor Si etc., and a metal Au etc. are used for the non-superconductor layers so that each superconducting junction has different properties for each application.

The thickness of the non-superconductor layer of the stacked type junction is determined by the coherence length of the superconductor. In general, the thickness of the non-superconductor layer of the stacked type junction must be within a few times of the coherence length of the superconductor. On the other hand, since oxide superconductor materials have a very short coherence length, therefore, a thickness of a non-superconductor layer must be about a few nanometers.

However, the superconductor layers and the non-superconductor layer of the stacked type junction must be of high crystallinity for favorable junction properties, which are composed of single crystals or composed of polycrystals which are orientated in almost the same direction. It is difficult to stack an extremely thin and high crystalline non-superconductor layer on an oxide superconductor layer. Additionally, it is very difficult to stack a high crystalline oxide superconductor layer on the non-superconductor layer stacked on an oxide superconductor layer. Though the stacked structure including a first oxide superconductor layer, a non-superconductor layer and a second oxide superconductor layer is realized, the interfaces between the oxide superconductor layers and the non-superconductor layer are not in good condition so that the stacked type junction does not function in good order.

In order to manufacture a point contact type junction, a Dayem bridge type junction and a variable thickness bridge type junction by using oxide superconductor, very fine processings which realize a weak link of a pair of superconductor are necessary. It is very difficult to conduct fine processing with good repeatability.

The point contact type junction has been formed of two oxide superconductor thin films which are in contact with each other in a extremely small area which constitutes the weak link of the Josephson junction.

The Dayem bridge type junction has been formed of a constant thickness oxide superconductor thin film which is formed on a substrate and which is patterned in a plan view, so that a superconductor thin film region having a greatly narrow width is formed between a pair of superconductor thin film regions having a sufficient width. In other words, the pair of superconductor thin film regions having a sufficient width are coupled to each other by the superconductor thin film region having the greatly narrow width. Namely, a weak link of the Josephson junction in the superconductor thin film is formed at the greatly narrow width region.

On the other hand, the variable thickness bridge type junction has been formed of an oxide superconductor thin film of a sufficient thickness which is formed on a substrate and which is partially etched or thinned in a thickness direction, so that a thinned oxide superconductor thin film portion is formed between a pair of superconductor thin film portions having sufficient thickness. In other words, the pair of superconductor thin film portions having the sufficient thickness are coupled to each other by the thinned oxide superconductor thin film portion. Accordingly, a weak link of the Josephson junction is formed at the reduced thickness portion of the oxide superconductor thin film.

As would be understood from the above, the characteristics of the Josephson device has a close relation to the contact area of the superconductor thin film in the point contact type Josephson device, the width of the superconductor thin film region having the extremely narrow width in the Dayem bridge type Josephson device, and to the thickness of the thinned oxide superconductor thin film portion in the variable thickness bridge type Josephson device, both of which form the weak link of the Josephson junction. Therefore, in order to obtain a desired characteristics with a good repeatability, a high precision on a sub-micron level of the processing such as the etching is required.

The Dayem bridge type Josephson device can be said to be more preferable than the variable thickness bridge type Josephson device, since the Dayem bridge type Josephson device has a relatively planer surface, which is preferred in a integrated circuit. However, in order to form the weak link in the Dayem bridge type Josephson device, it is required to pattern an oxide superconductor thin film having the thickness on the order of 0.5 μm to 1.0 μm into a width of not greater than 0.2 μm. However, it is very difficult to conduct this fine patterning with good repeatability.

On the other hand, in the variable thickness bridge type Josephson device, the very fine patterning is not required in order to form the weak link. However, it is very difficult to uniformly control the remaining thickness of the thinned portion forming the weak link. In addition, the variable thickness bridge type Josephson device cannot have a planer surface by nature. This is not preferable is the integrated circuit application.

Therefore, in the prior art, it is almost impossible to manufacture a superconducting device which has multiple homogeneous Josephson junctions by using an oxide superconductor.

In order to resolve the above mentioned problems, so-called step type Josephson junction device is proposed in the prior art. A Josephson junction device of this type comprises a substrate which includes a step on a principal surface and an oxide superconductor thin film formed on the principal surface of the substrate. The oxide superconductor thin film has grain boundaries at the step portion so that the oxide superconductor thin film separates two parts above and below the step which is linked weakly by the grain boundaries. Each of the parts constitutes a superconducting electrode, and the grain boundaries constitute a weak link of the Josephson junction. Thus, the above oxide superconductor thin film constitutes a Josephson junction device.

No fine processing which is required to manufacture a point contact type Josephson junction device, a Dayem bridge type Josephson junction device or a variable thickness bridge type Josephson junction device is necessary to manufacture the step type Josephson junction device.

In the prior art, the step of the principal substrate has been formed by an etching process, for example an ion-milling using Ar ions, a reactive ion etching, a wet etching using HCl, etc. However, the step formed by an etching process has a dull edge. When an oxide superconductor thin film is deposited on the substrate, grain boundaries are formed rather wide range on the dull edge of the step. A weak link of the Josephson junction formed by the wide grain boundaries does not have good characteristics. In addition, the etched surface of the substrate is often degraded so that no oxide superconductor thin film of high crystallinity can grow on the etched surface.

SUMMARY OF THE INVENTION

Accordingly, it is an object of the present invention to provide an improved step type Josephson junction device composed of an oxide superconductor material, which has overcome the above mentioned defects of the conventional ones.

Another object of the present invention is to provide a process for manufacturing a Josephson junction device with good repeatability by using already established processing techniques.

The above and other objects of the present invention are achieved in accordance with the present invention by a Josephson junction device comprising a single crystalline substrate including a principal surface, a layer of the same material as the substrate formed on the principal surface of the substrate so as to form a step on the principal surface, and an oxide superconductor thin film formed on the principal surface of the substrate, which includes a first and a second superconducting portions respectively positioned above and below the step, which are constituted of single crystals of the oxide superconductor, a junction portion between the first and second superconducting portions, which is constituted of a single crystal of the oxide superconductor of which crystal orientation is different from those of the first and second superconducting portions, and grain boundaries between the first superconducting portion and the junction portion and between the second superconducting portion and the junction portion, which constitute one weak link of the Josephson junction.

The step of the substrate of the Josephson junction device in accordance with the present invention is formed of the same material as that of the substrate. The exposed crystal lattices of the surface of the step are in the same condition as that of the principal surface of the substrate. Therefore, the first and the second superconducting portions of the oxide superconductor thin film are formed of single oxide superconductor crystals having the same crystal orientation. In addition, since the principal surface of the substrate has not been etched and degraded, the oxide superconductor thin film has high quality so that the characteristics of the Josephson junction device becomes excellent.

It is preferable that the step has a height of 100 to 500 nanometers and the oxide superconductor thin film has a thickness of 100 nanometers to 1 µm. The height of the step concerns the thickness of the oxide superconductor thin film. Namely, as the oxide superconductor thin film becomes thicker, the step preferably becomes higher. If the step is too low for the thickness of the oxide superconductor thin film, the oxide superconductor of the junction portion does not have enough crystallinity so that the characteristics of the Josephson junction is spoiled. On the other hand, if the step is too high, the grain boundaries become too far away from each other so that each of the weak links independently operates.

In a preferred embodiment, the substrate is formed of a material selected from the group consisting of a MgO (100) substrate, a $SrTiO_3$ (110) substrate and a YSZ (yttrium stabilized zirconia) substrate. These substrate materials are very effective in forming or growing a crystalline oxide superconductor thin film having a high orientation property.

In a preferred embodiment, the oxide superconductor is formed of high-$T_c$ (high critical temperature) oxide superconductor, particularly, formed of a high-$T_c$ copper-oxide type compound oxide superconductor for example a Y—Ba—Cu—O compound oxide superconductor material, a Bi—Sr—Ca—Cu—O compound oxide superconductor material, and a Tl—Ba—Ca—Cu—O compound oxide superconductor material.

According to another aspect of the present invention, there is provided a process for manufacturing a Josephson junction device comprising the steps of forming on a portion of a principal surface of the single crystalline substrate a lift-off layer composed of a material which can be easily removed without disturbing the substrate, depositing a layer of the same material as that of the substrate over the principal surface of the substrate, removing the lift-off layer with a portion of the layer on it so that a step is formed on the principal surface of the substrate and forming an oxide superconductor thin film on the principal surface of the substrate so that the oxide superconductor thin film includes a first and a second portions respectively positioned above and below the step of the substrate, which are constituted of single crystals of the oxide superconductor, a junction portion between said the first and second superconducting portions, which are constituted of a single crystal of the oxide superconductor having a different crystal orientation from the first and second superconducting portions, and grain boundaries between the first superconducting and the junction portion and between the second superconducting portion and the junction portion, which constitute one weak link of the Josephson junction.

In one preferred embodiment, the lift-off layer is formed of NaCl. In another preferred embodiment, the lift-off layer is formed of CaO. The lift-off layer formed of NaCl or CaO can be removed by a water wash without disturbing the principal surface of the substrate. Therefore, a high quality oxide superconductor thin film can be deposited on the principal surface of the substrate.

In addition, by the process in accordance with the present invention, a sharp edge of the step can be formed so that each of the grain boundaries of the oxide superconductor thin film is generated in a narrow range. These narrow grain boundaries are favorable to constitute a weak link of the Josephson junction of good characteristics.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 1A to 1G, an embodiment of the process in accordance with the present invention for manufacturing the Josephson device in accordance with the present invention will be described.

Figure 1A:
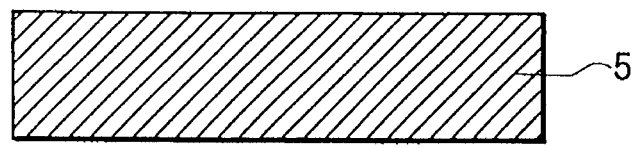
FIGS. 1A to 1G are diagrammatic views for illustrating an embodiment of the process for manufacturing the Josephson junction device in accordance with the present invention.

As shown in FIG. 1A, an MgO (100) single crystalline substrate 5 having a substantially planar principal surface ((100) plane) was prepared. In this embodiment, the MgO (100) substrate was used, however, $SrTiO_3$ (110) substrate and YSZ (yttrium stabilized zirconia) substrate can be used.

Figure 1B:
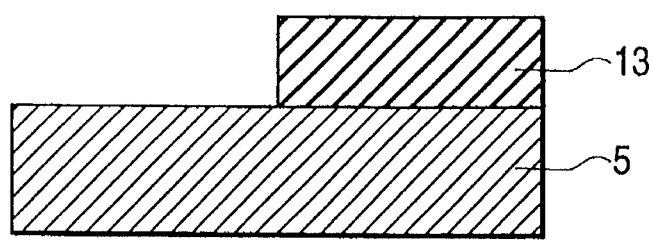

Then, as shown in FIG. 1B, a photoresist layer 13 was formed on a portion of the principal surface of the MgO substrate 5, on which an MgO layer would be deposited.

Figure 1C:
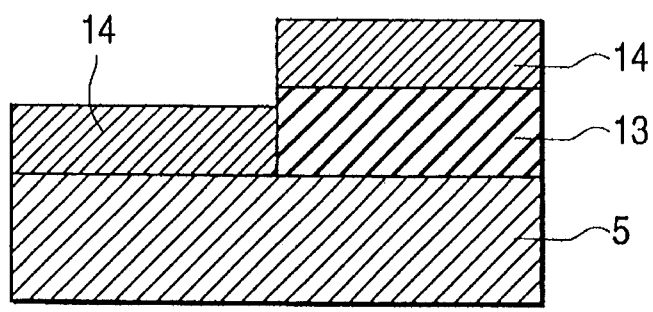

Thereafter, as shown in FIG. 1C, an NaCl layer 14 having a thickness of 200 nanometers was deposited by a sputtering on the exposed portion of the principal surface of the MgO substrate 5 and the photoresist layer 13. The condition of the sputtering process was as follows;

| Temperature of substrate | 30 to 50° C. |
| --- | --- |
| Sputtering gas Ar | 20 sccm |
| Pressure | $1.6 \times 10^{-2}$ Torr |
| RF power | 100 W |

The NaCl layer 14 is preferably formed by a physical deposition process, for example, an MBE (molecular beam epitaxy), a vacuum evaporation, a laser ablation, etc. other than a sputtering process. As explained hereinafter, the NaCl layer 14 was used as a lift-off layer. CaO can be used for the lift-off layer other than NaCl. Since the lift-off layer formed of NaCl or CaO can be removed by using water without disturbing the substrate.

Figure 1D:
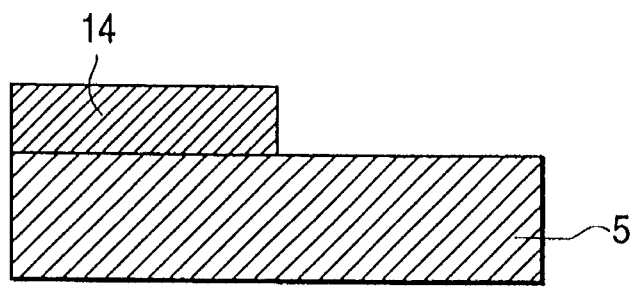
Figure 1E:
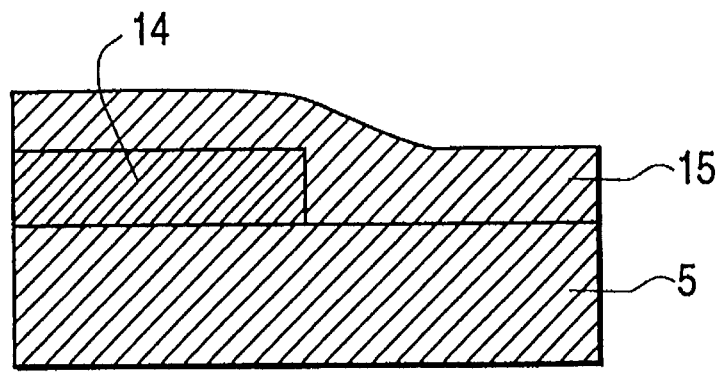

Thereafter, as shown in FIG. 1D, the photoresist layer 13 was removed so that the NaCl layer 14 remained on a left half portion of the principal surface of the substrate 5 and a right half portion of the principal surface of the substrate 5 was exposed. Then, an MgO layer 15 having a thickness of 200 nanometers was deposited on the exposed portion of the principal surface of the substrate 5 and the NaCl layer 14, as shown in FIG. 1E. The MgO layer was formed by a sputtering process under the following condition;

| Temperature of substrate | 250° C. |
| --- | --- |
| Sputtering gases | |
| Ar | 16 sccm |
| $O_2$ | 4 sccm |
| Pressure | $5 \times 10^{-2}$ Torr |
| RF power | 100 W |
| Electrode diameter | $\phi$100 mm |

Figure 1F:
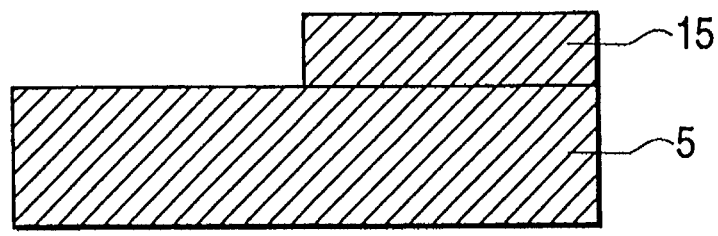
Figure 1G:
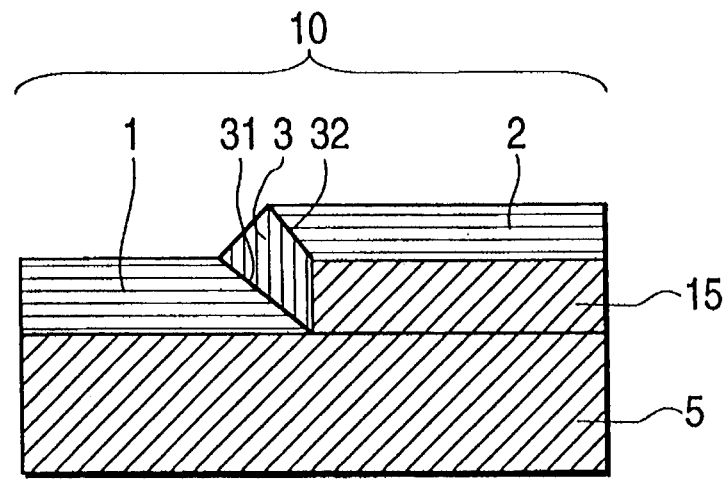

Thereafter, the substrate 5 was washed with water so as to remove the NaCl layer 14 and a portion of the MgO layer 15, so that the MgO layer 15 remained on the right half portion of the principle surface of the substrate 5 and a step was formed on the principle surface of the substrate 5, as shown in FIG. 1F. The edge of the step was formed quite sharp. In this step, the portion of the MgO layer 15 was removed by a lift-off process using the NaCl layer 14 as a lift-off layer. Finally, a $Y_1Ba_2Cu_3O_{7-x}$ oxide superconductor thin film 10 having a thickness of 300 nanometers was deposited over the principle surface of the substrate 5 by a sputtering process. The condition of the sputtering process was as follows;

| Temperature of substrate | 650° C. |
| --- | --- |
| Sputtering gases | |
| Ar | 8 sccm |
| $O_2$ | 4 sccm |
| Pressure | $5 \times 10^{-2}$ Torr |

The $Y_1Ba_2Cu_3O_{7-x}$ oxide superconductor thin film 10 can be formed by an MBE (molecular beam epitaxy), a vacuum evaporation, a laser ablation, etc.

The $Y_1Ba_2Cu_3O_{7-x}$ oxide superconductor thin film 10 had two superconducting portions 1 and 2, and one junction portion 3. The superconducting portions 1 and 2 were formed of c-axis orientated $Y_1Ba_2Cu_3O_{7-x}$ oxide superconductor thin films which had c-axes of crystals perpendicular to the principle surface of the substrate 5. On the other hand, c-axes of $Y_1Ba_2Cu_3O_{7-x}$ oxide superconductor crystal of the junction portion 3 was parallel to the principle surface of the substrate 5, so that the crystal orientation of the oxide superconductor of the junction portion 3 was different from those of the superconducting portions 1 and 2. Therefore, grain boundaries 31 and 32 were formed between the superconducting portion 1 and the junction portion 3, and between the superconducting portion 2 and the junction portion 3. Each of these grain boundaries 31 and 32 constituted a weak link of the Josephson junction. However, the grain boundaries 31 and 32 were formed in close proximity to each other so that the weak links of the Josephson junction operated as one weak link of the Josephson junction.

The superconducting portions 1 and 2 might be processed to form superconducting electrodes and metal contacts might be formed on them, if necessary.

A current-voltage characteristics of the above mentioned Josephson junction device was measured at a temperature of 85K. When a microwave of 15 GHz and of 0.2 mW was irradiated, clear Shapiro steps was observed at multiple voltages of 31 μV, and therefore, it could be ascertained that the Josephson junction was realized in the device.

As explained above, if the above mentioned Josephson junction device is manufactured in accordance with the above mentioned process, the limitation in the fine processing technique required for manufacturing the Josephson junction device is relaxed. In addition, since the superconducting barrier is constituted of the grain boundary, it becomes easy to form the superconducting barrier sharply. Accordingly, it is easy to manufacture the Josephson junction device with good repeatability, and the manufactured Josephson junction device has a stable performance.

In the above mentioned embodiments, the oxide superconductor thin film can be formed of not only the Y—Ba—

Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A Josephson junction device, comprising:

a single crystalline substrate including a principal surface, a layer of the same material as the substrate formed on the principal surface of the substrate so as to form a step on the principal surface, an oxide superconductor thin film formed on the principal surface of the substrate, which includes a first and a second superconducting portions respectively positioned above and below the step, which are constituted of single crystals of the oxide superconductor, a junction portion between the first and second superconducting portions, which is constituted of a single crystal of the oxide superconductor of which crystal orientation is different from those of the first and second superconducting portions, and grain boundaries between the first superconducting portion and the junction portion and between the second superconducting portion and the junction portion, which constitute one weak link of the Josephson junction, and wherein an edge of said step is substantially perpendicular to the principal surface of the substrate.

2. A Josephson junction device claimed in claim 1 wherein the substrate is formed of a material selected from the group consisting of a MgO (100) substrate, a SrTiO$_3$ (110) substrate and a YSZ (yttrium stabilized zirconia) substrate.

3. A Josephson junction device claimed in claim 1 wherein the oxide superconductor thin film is formed of a high-$T_c$ (high critical temperature) oxide superconductor, particularly, formed of a high-$T_c$ copper-oxide type compound oxide superconductor.

4. A Josephson junction device claimed in claim 3 wherein the oxide superconductor thin film is formed of an oxide superconductor material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

5. A Josephson junction device as claimed in claim 1, wherein the step has a height of 100 to 500 nm.

6. A Josephson junction device as claimed in claim 1, wherein the oxide superconductor thin film has a thickness of 100 nm to one μm.

7. A Josephson junction device as claimed in claim 1, wherein the first and second portions of the oxide superconductor thin film have the same crystal orientation.

8. A Josephson junction device as claimed in claim 1, wherein the principal surface of the substrate is substantially planar.

9. A Josephson junction device as claimed in claim 1, wherein the oxide superconductor thin film comprises $Y_1Ba_2Cu_3O_{7-x}$.

10. A Josephson junction device as claimed in claim 1, wherein the first and second portions of the oxide superconductor thin film have their c-axes perpendicular to the principal surface of the substrate and the junction portion has its c-axes parallel to the principal surface of the substrate.

11. A Josephson junction device, comprising:

a single crystalline substrate including a principal surface, a layer of the same material as the substrate formed on the principal surface of the substrate so as to form a step on the principal surface, and an oxide superconductor thin film formed on the principal surface of the substrate, said oxide superconductor thin film including:

first and second superconducting portions respectively positioned above and below the step and constituted of single crystals of the oxide superconductor, a junction portion between the first and second superconducting portions, said junction portion being constituted of a single crystal of the oxide superconductor having a crystal orientation which is different from those of the first and second superconducting portions, and grain boundaries between the first superconducting portion and the junction portion and between the second superconducting portion and the junction portion constituting a weak link of the Josephson junction, wherein the first and second portions of the oxide superconductor thin film have their c-axes perpendicular to the principal surface of the substrate and the junction portion has its c-axes parallel to the principal surface of the substrate, and wherein an edge of said step is substantially perpendicular to the principal surface of the substrate.

* * * * *